(12) United States Patent
Kim (10) Patent No.: US 7,697,113 B2
(45) Date of Patent: Apr. 13, 2010

(54) METHOD OF DETERMINING A FOCUS POSITION FOR A SUBSTRATE EXPOSURE PROCESS AND SUBSTRATE EXPOSURE APPARATUS CAPABLE OF PERFORMING THE SAME

(75) Inventor: Eun-Sung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 561 days.

(21) Appl. No.: 11/589,720

(22) Filed: Oct. 31, 2006

(65) Prior Publication Data

US 2007/0103663 A1 May 10, 2007

(30) Foreign Application Priority Data

Nov. 9, 2005  (KR) .................. 10-2005-0106720

(51) Int. Cl.
G03B 27/52 (2006.01)
G01J 1/20 (2006.01)
G03B 27/42 (2006.01)
(52) U.S. Cl. .................. 355/55; 250/201.1; 355/53
(58) Field of Classification Search .................. 355/30, 355/53, 55; 250/201.1–201.9
See application file for complete search history.

(56) References Cited

U.S. PATENT DOCUMENTS

| 5,502,311 | A | 3/1996 | Imai et al. |
| 6,151,102 | A | 11/2000 | Nishi |
| 6,388,736 | B1 | 5/2002 | Smith et al. |
| 2004/0080736 | A1* | 4/2004 | Suzuki et al. .................. 355/53 |
| 2005/0195379 | A1* | 9/2005 | Stanton et al. .................. 355/67 |

FOREIGN PATENT DOCUMENTS

| JP | 07-226355 | 8/1995 |
| JP | 09-304015 | 11/1997 |
| KR | 10-2005-0069558 | 7/2005 |

OTHER PUBLICATIONS

Office Action for Korean Application No. 10-2005-106720 dated Apr. 20, 2007.

* cited by examiner

*Primary Examiner*—Alan A Mathews
*Assistant Examiner*—Mesfin T Asfaw
(74) *Attorney, Agent, or Firm*—Harness, Dickey & Pierce, P.L.C.

(57) ABSTRACT

In a method of determining a focus position for a substrate exposure process and a substrate exposure apparatus capable of performing the same, a reticle having a light-transmitting region may be illuminated by an off-axis illumination light. A projected light, which is transmitted through the reticle and a projection optical system, may be detected by a light sensor disposed on a substrate stage. An intensity of the projected light measured at a light-receiving surface of the light sensor may vary in accordance with positions of the light-receiving surface. The focus position may be determined based on the variations in the intensity of the projected light.

16 Claims, 8 Drawing Sheets

METHOD OF DETERMINING A FOCUS POSITION FOR A SUBSTRATE EXPOSURE PROCESS AND SUBSTRATE EXPOSURE APPARATUS CAPABLE OF PERFORMING THE SAME

PRIORITY STATEMENT

This application claims priority from Korean Patent Application No. 10-2005-0106720, filed on Nov. 9, 2005, in the Korean Intellectual Property Office (KIPO), the entire contents of which are incorporated herein by reference.

BACKGROUND OF THE INVENTION

1. Field of the Invention

Example embodiments relate to a method of determining a focus position for a substrate exposure process and a substrate exposure apparatus capable of performing the same. More particularly, example embodiments relate to a method of determining a focus position for an exposure process for transcribing image patterns onto a substrate such as a semiconductor wafer, for example, and an exposure apparatus capable of performing the same.

2. Description of the Related Art

In a fabrication process, electronic circuits may be formed on a semiconductor substrate such as a silicon wafer, for example. An electrical die sorting (EDS) process may be performed for inspecting electrical characteristics of elements and/or semiconductor devices formed on the semiconductor substrate. In a packaging process, semiconductor devices may be separated and packaged with epoxy resin.

The fabrication process may include a number of processes which are repeatedly performed to form electrical elements on the semiconductor substrate. For example, the fabrication process may include a deposition process, a photolithography process, an etching process, a chemical mechanical polishing process, an ion implantation process, a cleaning process, etc.

The photolithography process may be performed to form photoresist patterns on a layer formed by the deposition process. The photoresist patterns may be used as etching masks in the etching process so that the layer is formed into patterns having electrical characteristics.

The photolithography process may include a photoresist coating process for forming a photoresist layer on the semiconductor substrate, a baking process for hardening the photoresist layer, an exposure process for transcribing image patterns onto the photoresist layer, a development process for developing the photoresist layer to form the photoresist patterns, etc.

As semiconductor devices become highly integrated, sizes of patterns to be formed on the semiconductor substrate are reduced and thus, resolution becomes increasingly more important in the photolithography process. The resolution in the photolithography process may be influenced by a depth of focus (DOF), a focus position, etc.

Further, the resolution in the photolithography process may be influenced by a wavelength of an illumination light and/or a numerical aperture (NA) of a projection lens. Examples of the illumination light used in a photolithography process may include a g-line light beam having a wavelength of 436 nm, an i-line light beam having a wavelength of 365 nm, a krypton-fluoride (KrF) laser beam having a wavelength of 248 nm, an argon-fluoride (ArF) laser beam having a wavelength of 193 nm, and an $F_2$ laser beam having a wavelength of 157 nm.

Increasing the numerical aperture of the projection lens to improve the resolution may cause the DOF to deteriorate. An off-axis illumination (OAI) may be used to improve the DOF by projecting zero-order and positive first-order light beams diffracted by image patterns of a reticle onto a semiconductor substrate.

Examples of the OAI may include an annular illumination, a dipole illumination, a quadrupole illumination, a cross-pole illumination, a hexapole illumination, etc.

Further, to increase the numerical aperture, various conventional techniques for improving focusing accuracy of a projected light passing through a reticle have been developed. However, as the integration degree of semiconductor devices increase, there still remains a need for an improved method of determining a best focus position for a substrate exposure process.

SUMMARY

Example embodiments provide an improved method of determining a focus position for a substrate exposure process.

Example embodiments provide a substrate exposure apparatus capable of performing an improved method of determining a focus position for a substrate exposure process.

According to an example embodiment, a reticle may have at least one light-transmitting region and may be illuminated by an off-axis illumination light. A projected light passing through the light-transmitting region may be focused onto a projection plane. An intensity of the projected light may be measured at the projection plane and may have at least one peak. Variations of the intensity and the peak at the projection plane may be measured while moving the projection plane in an optical axis direction of the projected light. A focus position may be determined based on the variations of the intensity and the at least one peak.

According to an example embodiment, the intensity of the projected light may have a plurality of peaks and the focus position may be determined as a position of the projection plane that corresponds to a minimum number of the peaks in a variation of the number of the peaks.

According to an example embodiment, the focus position may be determined as a position of the projection plane that corresponds to a maximum peak value in a variation of the intensity of the projected light.

According to an example embodiment, the off-axis illumination light may have a pair of poles. The light-transmitting region may extend in a direction substantially perpendicular to an arrangement direction of the poles.

According to an example embodiment, the reticle may have a plurality of light-transmitting regions arranged in substantially the same direction as an arrangement direction of a pair of poles. The light-transmitting regions may extend in a direction substantially perpendicular to the arrangement direction of the pair of poles. The focus position may be determined as a position of the projection plane that corresponds to a minimum distance between outermost peaks in a variation of a distance between the outermost peaks in accordance with changes in a position of the projection plane.

According to an example embodiment, the intensity of the projected light may be measured by a light sensor disposed on a stage for supporting a substrate. The projection plane may be a light-receiving surface of the light sensor.

According to an example embodiment, a substrate exposure apparatus may include an illumination optical system for providing an off-axis illumination light; a reticle stage for selectively supporting a first reticle having at least one light-transmitting region, or a second reticle having image patterns to be transcribed onto a substrate and disposed such that the first reticle or the second reticle is illuminated by the off-axis illumination light; a projection optical system for focusing a first projected light passing through the first reticle, or a second projected light passing through the second reticle; a substrate stage disposed adjacent to the projection optical system and movable in an optical axis direction of the projection optical system and a direction substantially perpendicular to the optical axis direction, the substrate stage having a substrate holder for holding the substrate to transcribe the image patterns onto the substrate; a light sensor disposed adjacent to the substrate holder on the substrate stage to measure an intensity of the first projected light having at least one peak and variations of the intensity and the peak in accordance with changes in a position of the substrate stage, the light sensor having a projection plane where the first projected light is focused thereon; and a focusing system for determining a focus position on the basis of the variations of the intensity and the peak.

An example embodiment provides a method of determining a focus position for a substrate exposure process. The method may include measuring an intensity of projected light at a projection plane, the intensity of the projected light having at least one peak; measuring variations of the intensity and the at least one peak at the projection plane while moving the projection plane in an optical axis direction of the projected light; and determining a focus position based on the variations of the intensity and the at least one peak.

An example embodiment provides a substrate exposure apparatus. The substrate exposure apparatus may include an illumination optical system providing an off-axis illumination light; a reticle stage supporting a reticle having at least one light-transmitting region, the reticle being illuminated by the off-axis illumination light; a projection optical system focusing projected light passing through the reticle; a substrate stage moving in an optical axis direction of the projection optical system and a direction substantially perpendicular to the optical axis direction, the substrate stage having a substrate holder for holding a substrate; a light sensor measuring an intensity of the projected light having at least one peak and variations of the intensity and the at least one peak in accordance with changes in a position of the substrate stage, the light sensor having a projection plane where the projected light is focused thereon; and a focusing system for determining a focus position based on the variations of the intensity and the at least one peak.

BRIEF DESCRIPTION OF THE DRAWINGS

Example embodiments will become readily apparent by considering the following detailed description of example embodiments in conjunction with the accompanying drawings wherein.

DESCRIPTION OF EXAMPLE EMBODIMENTS

Example embodiments are described more fully hereinafter with reference to the accompanying drawings. The example embodiments may, however, be embodied in many different forms and should not be construed as limited to the example embodiments set forth herein. Rather, these example embodiments are provided so that this disclosure will be thorough and complete. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the example embodiments.

Hereinafter, example embodiments will be explained in detail with reference to the accompanying figures.

Figure 1:
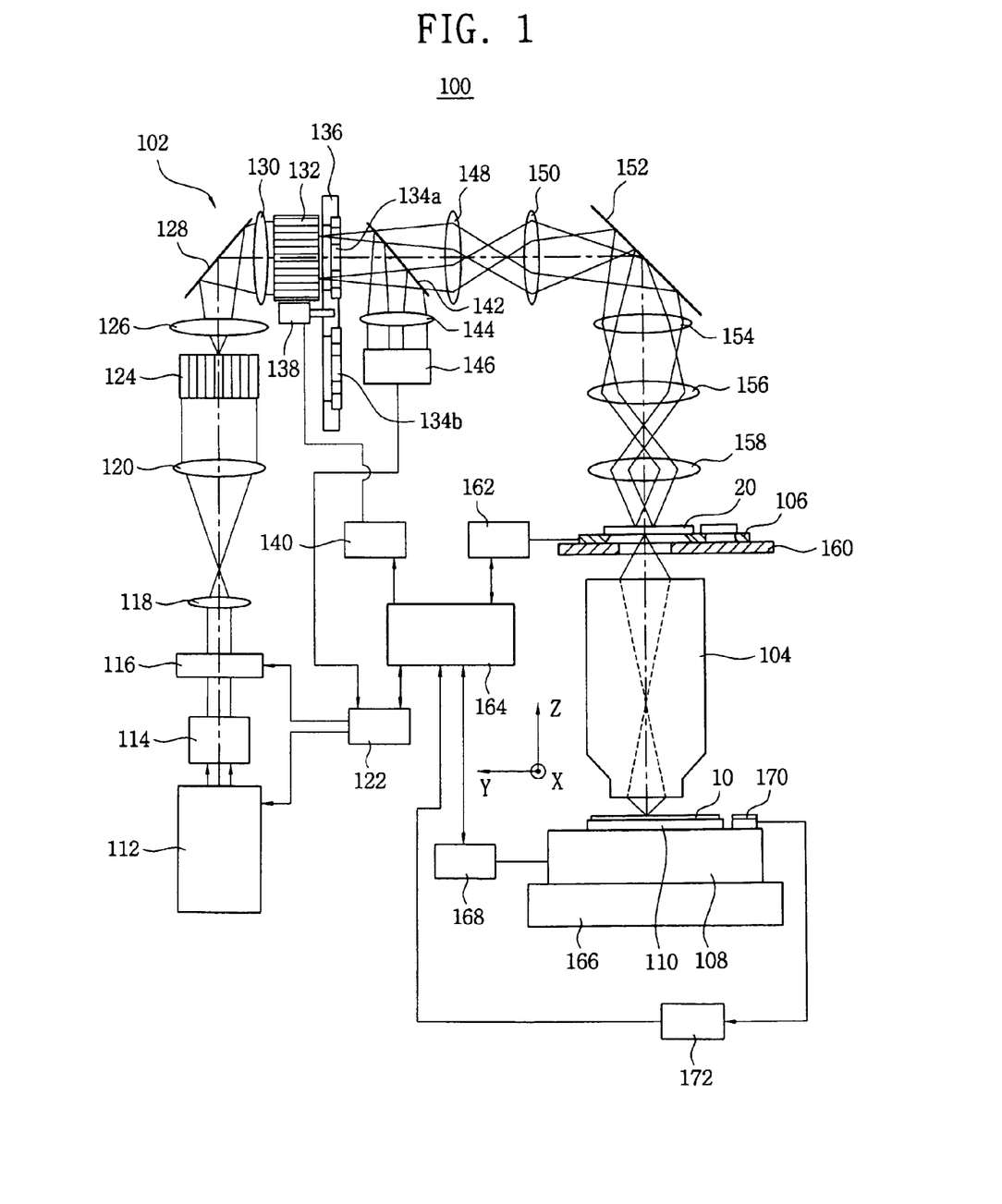
FIG. 1 is a schematic view illustrating an example embodiment of a substrate exposure apparatus.

FIG. 1 is a schematic view illustrating an example embodiment of a substrate exposure apparatus.

Referring to FIG. 1, a substrate exposure apparatus 100 may include an illumination optical system 102 and a projection optical system 104.

A reticle stage 106 may be used to support a reticle 20 having image patterns to be transcribed onto a semiconductor substrate 10 such as silicon wafer, for example. The reticle stage 106 may be disposed adjacent to the illumination optical system 102 to be illuminated by an illumination light provided from the illumination optical system 102. In detail, the reticle 106 may be disposed between the illumination optical system 102 and the projection optical system 104.

A substrate stage 108 for supporting the semiconductor substrate 10 may be disposed adjacent to the projection optical system 104 and may be movable in an optical axis direction of the projection optical system 104 and a direction substantially perpendicular to the optical axis direction. The substrate stage 108 may be disposed under the projection optical system 104. Further, the substrate stage 108 may have a substrate holder 110 for holding the semiconductor substrate 10.

The illumination optical system 102 may be used to direct an illumination light having a shape selected in accordance with the image patterns onto the reticle 20. The illumination optical system 102 may include a plurality of optical elements.

A light beam radiated from a light source 112 may be formed into the illumination light having the selected shape by passing light from the light source 112 through the optical elements. Image data related to the image patterns may be obtained by passing light through the reticle 20. A projected light passing through the reticle 20 may be directed onto the semiconductor substrate 10 by the projection optical system 104 and thus, the image patterns may be transcribed onto a photoresist layer formed on the semiconductor substrate 10.

Examples of the light source 112 may include an argon-fluoride (ArF) excimer laser, a krypton-fluoride (KrF) excimer laser, a fluorine ($F_2$) laser, an yttrium-aluminum-garnet (YAG) laser, a mercury lamp. The light beam radiated from the light source 112 may be directed into a beam shaping unit through a beam matching unit 114 for positionally matching an optical path with respect to a main exposure apparatus body and a light attenuator 116. The beam shaping unit may include a first lens system 118 and a second lens system 120 arranged along an optical axis. An exposure control system 122, which may be provided to control an exposure amount provided to the photoresist layer on the semiconductor substrate 10, may control the start and stop of the emission of the light source 112 as well as the output, for example, oscillation frequency and pulse energy. The exposure control may also adjust the dimming ratio for the light attenuator 116. The dimming ratio may be adjusted continuously or in a stepwise manner.

The light beam that has passed through the beam shaping unit may enter a first fly's-eye lens 124, which may serve as a first-stage optical integrator (uniformizer or homogenizer). The light beam, which exits from the first fly's-eye lens 124, may enter a first reflecting mirror 128 serving as an optical path-bending member after passing through a third lens system 126. The light beam reflected by the first reflecting mirror 128 may pass through a fourth lens system 130 and may enter a second fly's-eye lens 132 serving as a second stage optical integrator. A relay optical unit, which may serve as a light-collecting optical unit, may include the third and fourth lens systems 126 and 130.

The light beam that has passed through the second fly's-eye lens 132 may be formed into the illumination light having a specific shape once the light beam passes through an aperture plate 134a. The aperture plate 134a may be selected on the basis of the image patterns of the reticle 20. Accordingly, the selected aperture plate 134a may serve as an illumination light-forming member. One or more aperture plates 134a and 134b may be supported by a support member 136 having a disk shape, for example. The support member 136 may be disposed adjacent to a light-exiting plane of the second fly's-eye lens 132 and may be rotated using a rotational driving section 138.

The support member 136 may support the plurality of aperture plates 134a and 134b, and one of the aperture plates 134a and 134b may be selected in accordance with the image patterns. The selected aperture plate 134a may be placed in the path of the light beam by rotating of the support member 136 to a predetermined and/or desired location. Operation of the rotational driving section 138 may be controlled by a driving system 140, and the shape of the illumination light may be determined by the selected aperture plate 134a.

The illumination light that has passed through the selected aperture plate 134a may enter a beam splitter 142. The illumination light reflected by the beam splitter 142 may enter an integrator sensor 146 composed of a photoelectric detector via a light-collecting lens 144. A detection signal from the integrator sensor 146 may be provided to the exposure control system 122. The exposure control system 122 may indirectly monitor luminance of the illumination light and the integral value thereof in accordance with the detection signal of the integrator sensor 146.

The illumination light that has passed through the beam splitter 142 may sequentially pass through a fifth lens system 148 and a sixth lens system 150, and may then be reflected by a second reflecting mirror 152. The illumination light reflected by the second reflecting mirror 152 may enter an image-forming lens unit 154, and the illumination light that has passed through the image-forming lens unit 154 may sequentially pass through an auxiliary condenser lens unit 156 and a main condenser lens unit 158. The illumination light passing through the auxiliary and main condenser lens units 156 and 158 may illuminate the reticle 20.

Though not shown in figures, the second fly's-eye lens 132, the fifth lens system 148 and the sixth lens system 150 may be moved along the optical axis of the illumination light by driving sections controlled by the driving system 140.

The reticle stage 106 may be disposed on a reticle base 160 under the main condenser lens unit 158 and may support the reticle 20. The reticle stage 106 may be movable. In particular, the reticle stage 106 may move in a y-axis direction, as shown in FIG. 1, during an exposure process performed on the semiconductor substrate 10. Further, the reticle stage 106 may move in an x-axis direction and may rotate about the optical axis of the illumination light. A position and a rotation angle of the reticle stage 106 may be measured by a laser interferometer of a first driving control system 162. Based on the measurement results and control information from a main control system 164, a driving motor, for example, a linear motor and/or a voice coil motor, may control the scanning speed and position of the reticle stage 106.

The projected light that has been transmitted through the reticle 20 may have the image data related to the image pattern of the reticle 20 and may be directed onto the semiconductor substrate 10 by the projection optical system 104. The substrate stage 108 for supporting the semiconductor substrate 10 may be movably disposed on a substrate base 166. The substrate stage 108 may move in a direction opposite to the movement direction of the reticle stage 106 during the exposure process. In particular, the substrate stage 108 may move in a direction of the optical axis of the projected light and a direction substantially perpendicular to the direction of the optical axis in order to repeatedly perform the exposure process on shot areas of the semiconductor substrate 10. As shown in FIG. 1, the substrate stage 108 may move in the x-axis and y-axis directions in a stepping manner and may move to adjust a focus of the projected light in a z-axis direction.

A position and a rotation angle of the substrate stage 108 may be measured by a laser interferometer of a second driving control system 168. A driving motor, for example, a linear motor and/or a voice coil motor, of the second driving control system 168 may control the scanning speed and position of the substrate stage 108 on the basis of the measurement results and control information from the main control system 164.

The substrate holder 110 may be disposed on the substrate stage 108 to hold the semiconductor substrate 10, and a light sensor 170 may be disposed adjacent to the substrate holder 110 to determine a best focus position for the projected light. The light sensor 170 may have a projection plane and/or a light-receiving surface on which the projected light may be focused and may measure an intensity of the projected light. Further, the light sensor 170 may be connected with a focusing system 172 for determining a best focus position of the substrate stage 108 in accordance with the measured intensity of the projected light. The focusing system 172 may be connected with the main control system 164. The main control system 164 may move the substrate stage 108 such that a surface of the photoresist layer formed on the semiconductor substrate 10 may be positioned at the best focus position, which may be determined by the focusing system 172.

Figure 2:
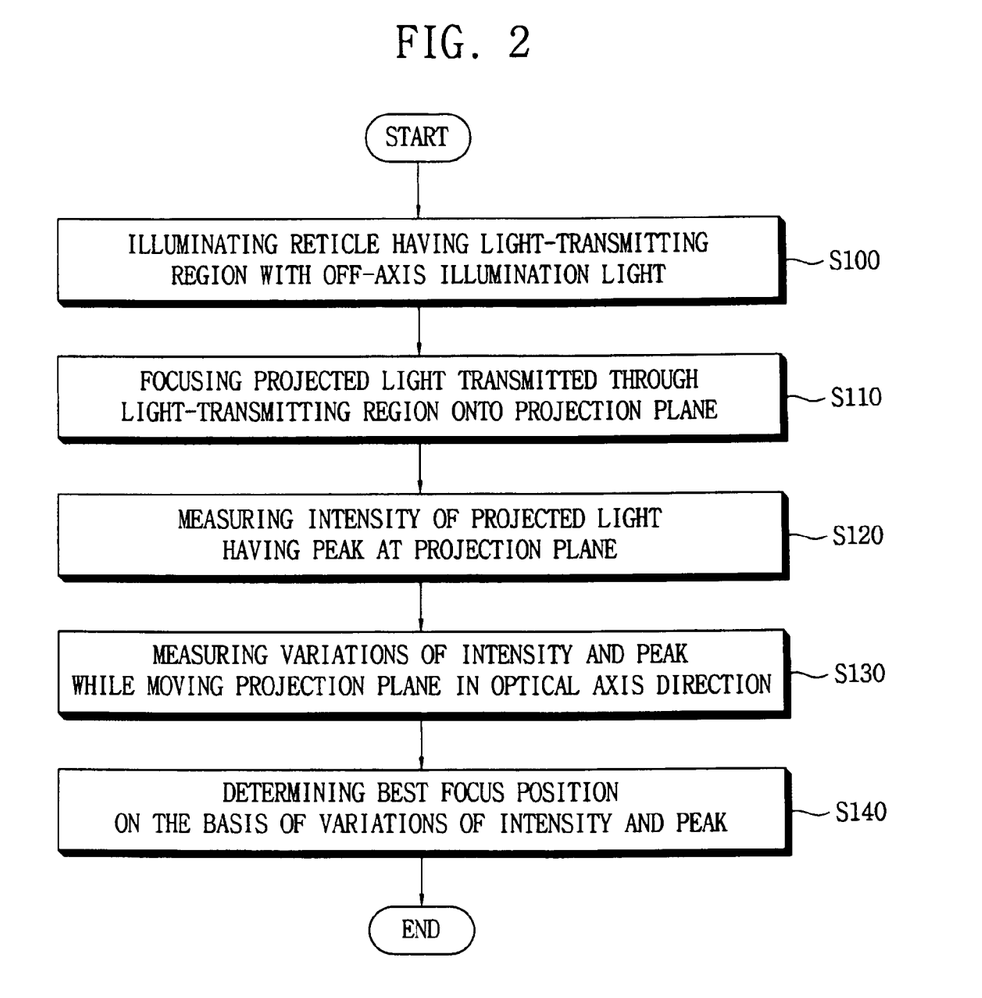
FIG. 2 is a flow chart illustrating an example embodiment of a method of determining a best focus position for a substrate exposure process using the substrate exposure apparatus as shown in FIG. 1, for example.
Figure 3:
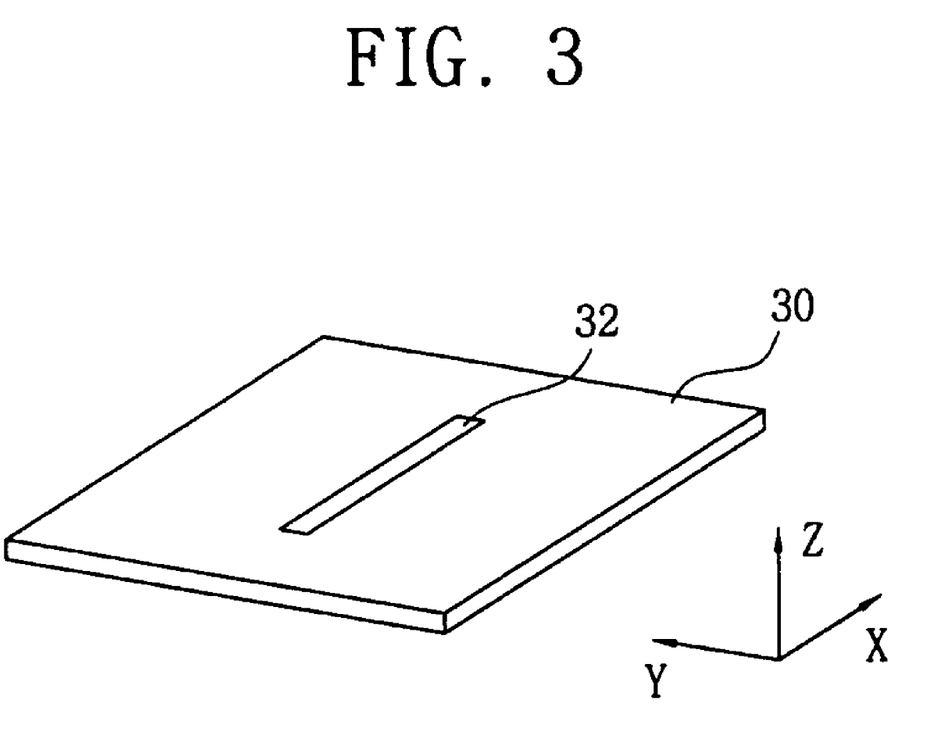
FIG. 3 is a perspective view illustrating an example embodiment of a reticle having a light-transmitting region.
Figure 4:
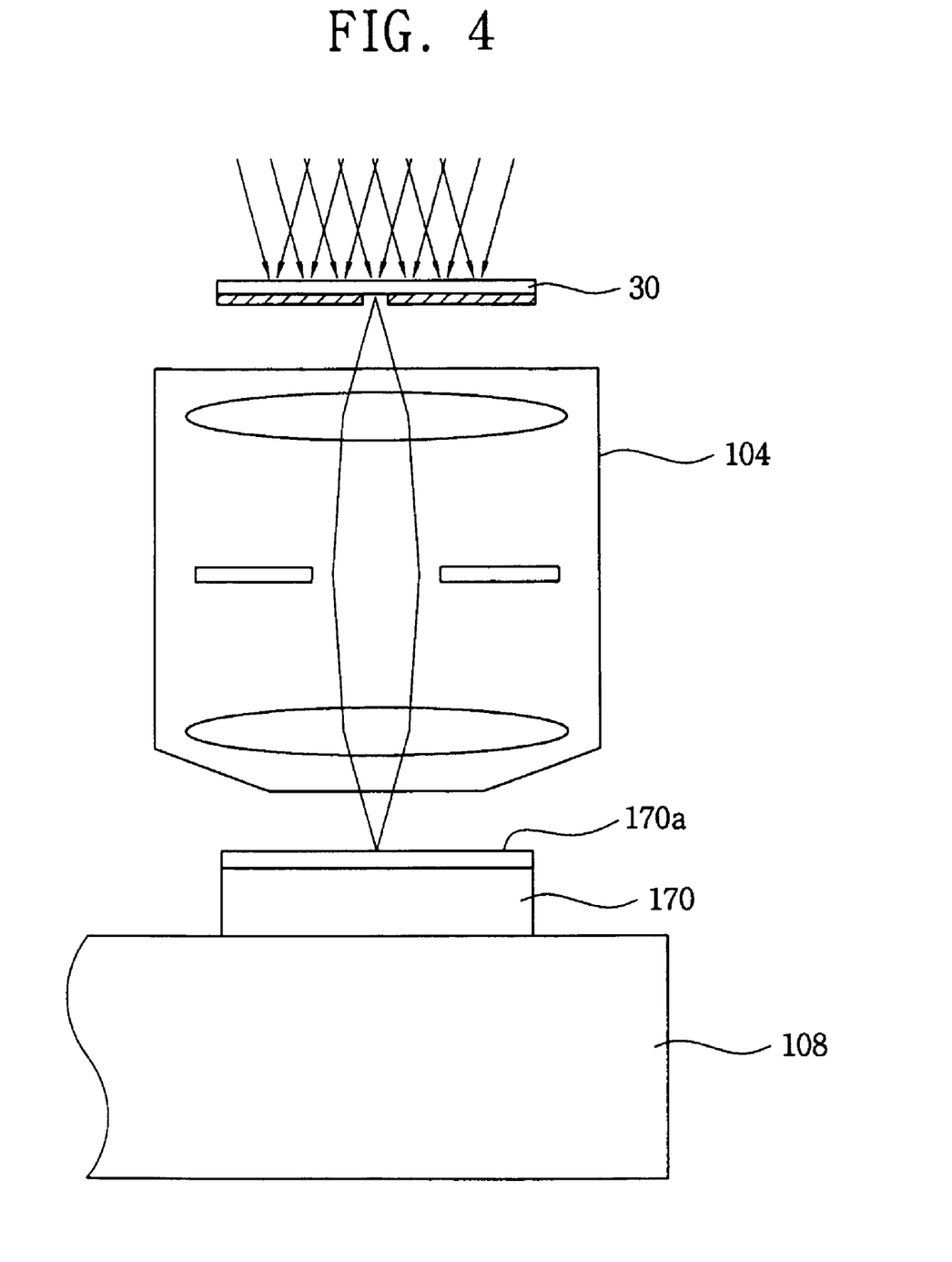
FIG. 4 is a schematic view illustrating projected light passing through the reticle shown in FIG. 3.

FIG. 2 is a flow chart illustrating an example embodiment of a method of determining a best focus position for a substrate exposure process using the substrate exposure apparatus as shown in FIG. 1, for example. FIG. 3 is a perspective view illustrating an example embodiment of a reticle having a light-transmitting region. FIG. 4 is a schematic view illustrating projected light passing through the reticle as shown in FIG. 3.

Referring to FIGS. 1 to 4, a reticle 30 having a light-transmitting region 32 may be illuminated by an off-axis illumination light (S100). A dipole illumination light having a pair of poles may be used as the off-axis illumination light. The dipole illumination light may be formed by the selected aperture plate 134a. The reticle 30 may be disposed on the reticle stage 106 as a substitute for the reticle 20 according to an example embodiment.

The light-transmitting region 32 of the reticle 30 may extend in a direction substantially perpendicular to an arrangement direction of the poles. For example, the selected aperture plate 134a has a pair of openings arranged in the z-axis direction. Poles of the illumination light that have been transmitted through the selected aperture plate 134a are arranged in the y-axis direction after being reflected by the second reflecting mirror 152. In the example shown in FIG. 3, the light-transmitting region 32 extends in the x-axis direction.

According to another example embodiment, a quadrupole illumination light having four poles may be used as the off-axis illumination light. Further, the off-axis illumination light may be formed by various diffractive optical elements.

Referring back to FIG. 2, a projected light passing through the light-transmitting region 32 may be focused onto the projection plane 170a, for example, the light-receiving surface 170a of the light sensor 170 disposed on the substrate stage 108 (S110).

The intensity of the projected light may be measured at the projection plane 170a (S120). The intensity of the projected light may have one or two peaks in accordance with the position of the substrate stage 108. In detail, the projected light may be directed onto the light-receiving surface 170a of the light sensor 170 by the projection optical system 104, and the intensity of the projected light may be measured by the light sensor 170. The light sensor 170 may be positioned under the projection optical system 104 by horizontal movement of the substrate stage 108, and the position of the substrate stage 108 may be controlled by the second driving control system 168.

Variations of the intensity and the peak at the projection plane 170a may be measured while moving the projection plane 170a (S130). The substrate stage 108 may be moved in a stepwise manner, for example, by the second driving control system 168, and the light sensor 170 may measure the variations of the intensity and the peak.

A best focus position may be determined based on the measured variations of the intensity and the peak (S140). The best focus position may be determined according to an example embodiment as a position of the projection plane 170a which corresponds to a minimum number of the peaks in the variation of the number of the peaks. In accordance with another example embodiment, the best focus position may be determined as a position of the projection plane that corresponds to a maximum peak value in a variation of the intensity of the projected light.

Figure 5:
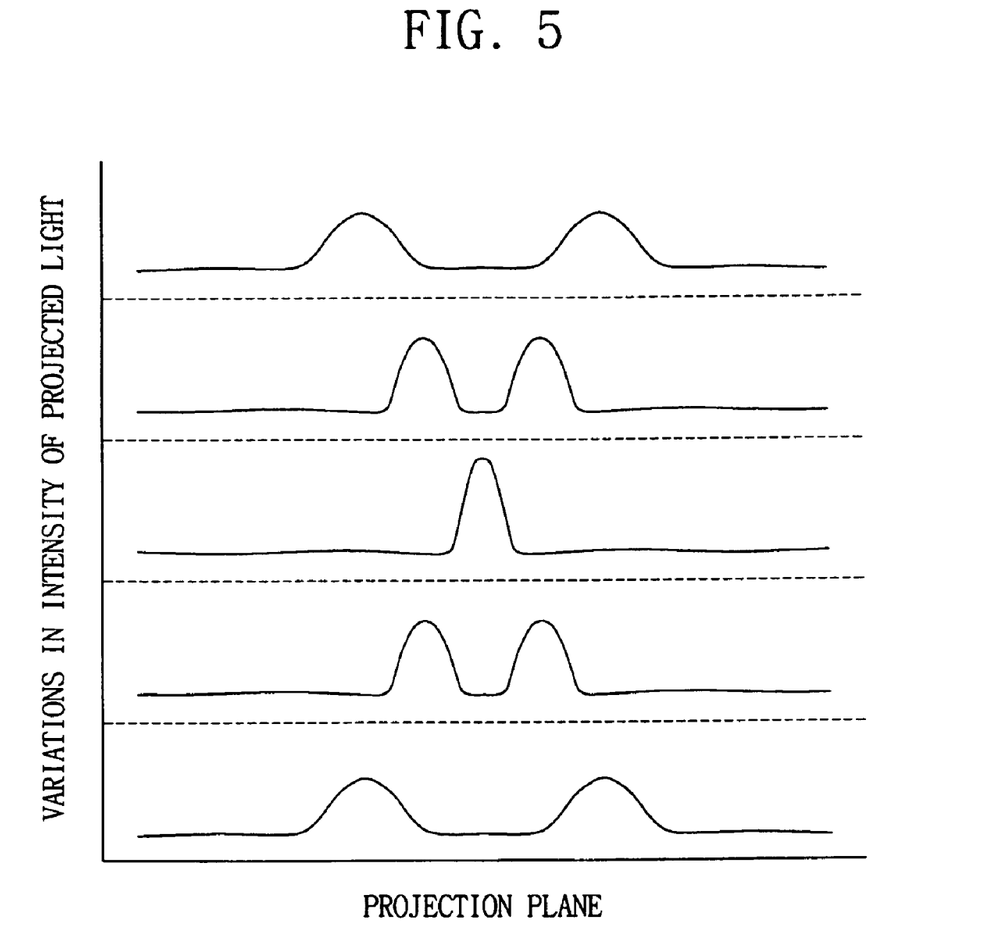
FIG. 5 is a graph showing example variation in intensity of the projected light passing through the reticle as shown in FIG. 3.

FIG. 5 is a graph showing example variation in an intensity of a projected light passing through the reticle as shown in FIG. 3.

FIG. 5 corresponds to an example, wherein the reticle 30 has one light-transmitting region 32 and the intensity of the projected light has one or two peaks depending on the position of the projection plane 170a. In detail, if the projection plane 170a is located at the best focus position, the intensity of the projected light has one peak. On the contrary, if the projection plane 170a is located at a position different from the best focus position, the intensity of the projected light has two peaks. Further, if the projection plane 170a is located at the best focus position, the intensity of the projected light has a maximum peak value.

The best focus position may be determined by the focusing system 172, and the second driving control system 168 may move the substrate stage 108 such that the surface of the photoresist layer of the semiconductor substrate 10 may be positioned at the best focus position. A height of the surface of the photoresist layer may be calculated on the basis of the position of the substrate stage 108 and thicknesses of the semiconductor substrate 10 and the photoresist layer. Alternatively, the height of the surface of the photoresist layer may be detected by conventional methods and apparatuses for detecting a plane position.

In the example embodiments described above, the reticle 30 is described as having one light-transmitting region 32; however, the best focus position may be determined using a reticle having a plurality of light-transmitting regions according to example embodiments as well.

Figure 6:
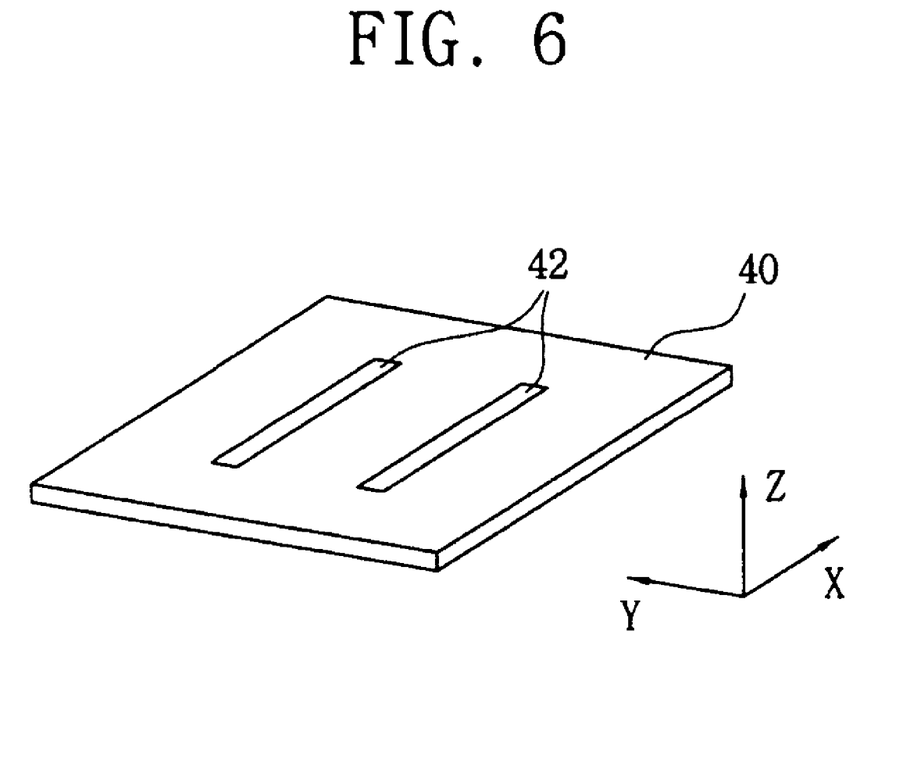
FIG. 6 is a perspective view illustrating an example embodiment of a reticle having a plurality of light-transmitting regions.
Figure 7:
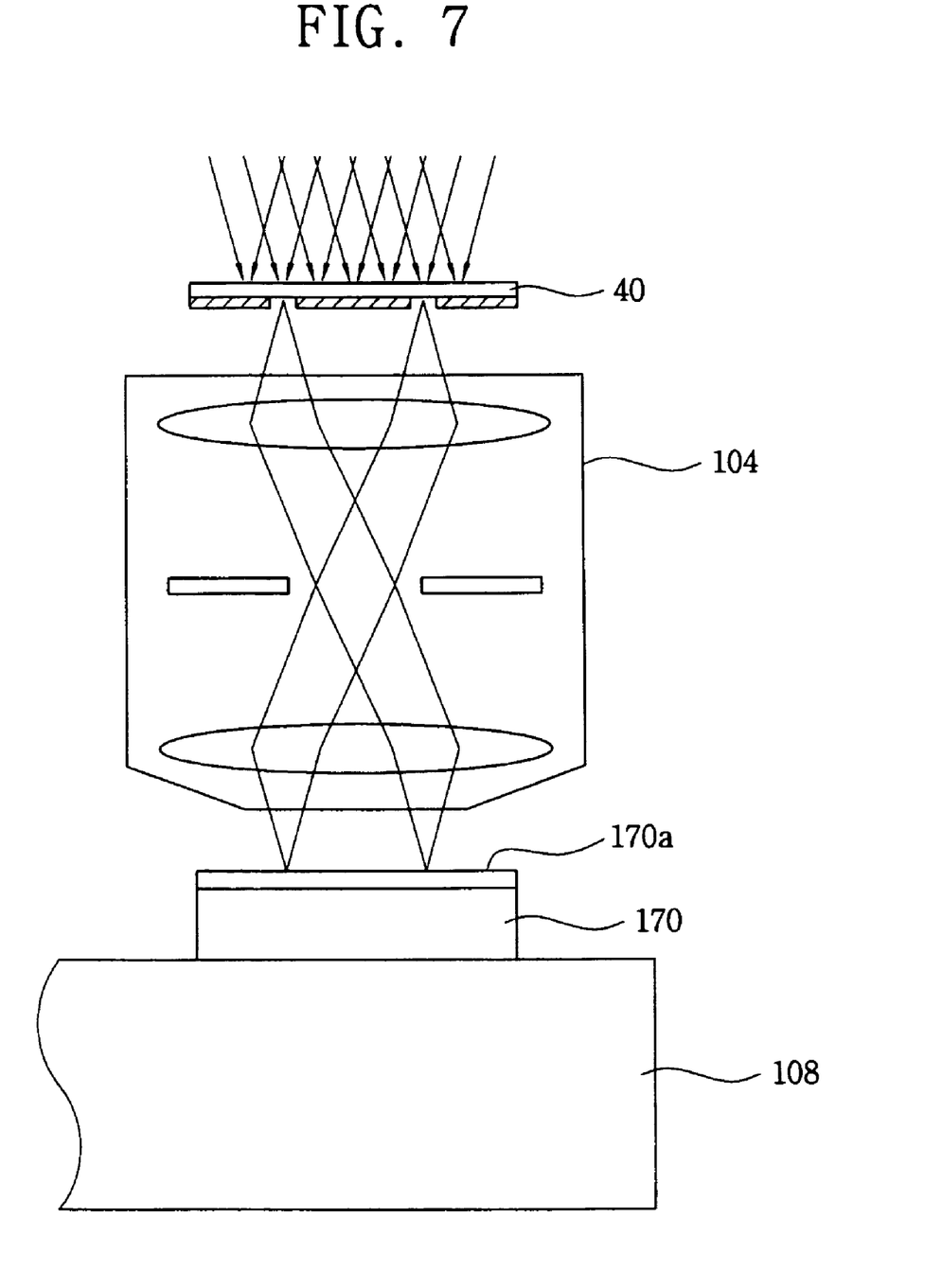
FIG. 7 is a schematic view illustrating projected light passing through the reticle shown in FIG. 6.
Figure 8:
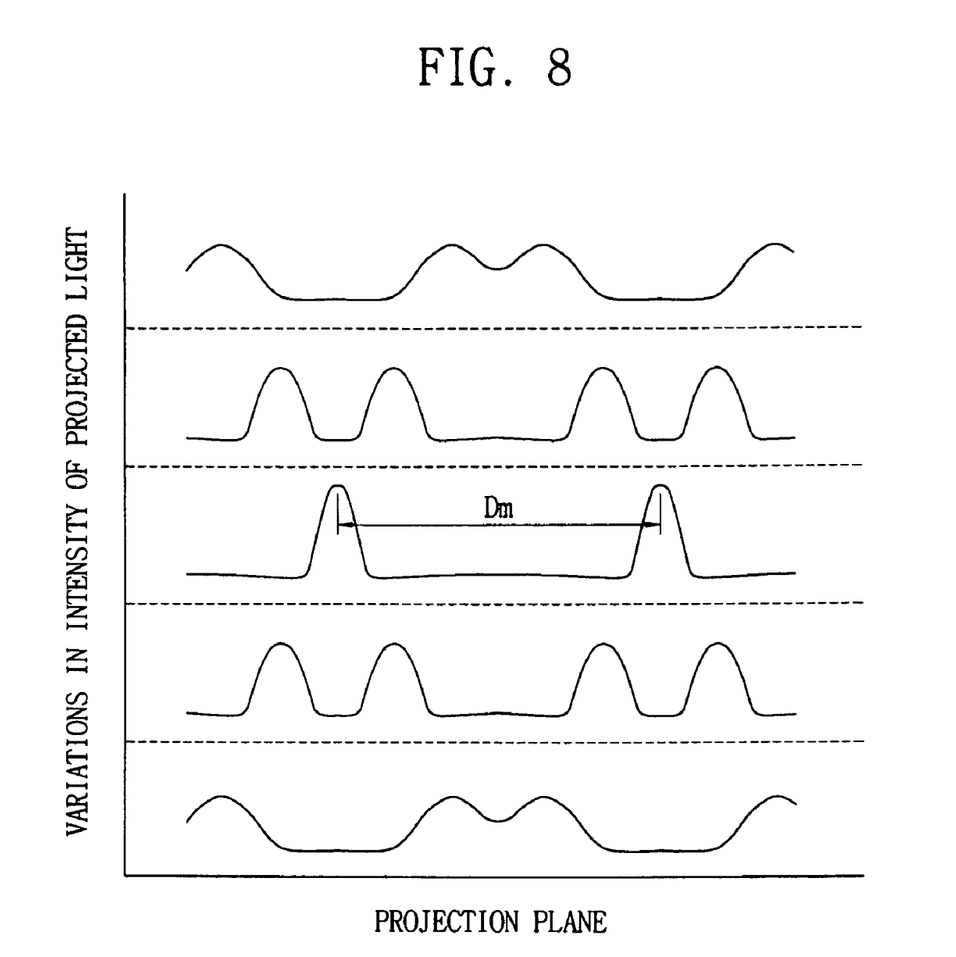
FIG. 8 is a graph showing example variation in intensity of the projected light passing through the reticle as shown in FIG. 6.

FIG. 6 is a perspective view illustrating an example embodiment of a reticle having a plurality of light-transmitting regions. FIG. 7 is a schematic view illustrating projected light passing through the reticle as shown in FIG. 6. FIG. 8 is a graph showing example variation in an intensity of projected light passing through the reticle as shown in FIG. 6.

Referring to FIGS. 6 to 8, a reticle 40 may have a pair of light-transmitting regions 42. The light-transmitting regions 42 may extend in a direction substantially perpendicular to the arrangement direction of the poles of the dipole illumination light and may be arranged in substantially the same direction as the arrangement direction of the poles.

A projected light passing through the light-transmitting regions 42 may be focused onto the light-receiving surface 170a of the light sensor 170 by the projection optical system 104.

If the projection plane 170a is located at a best focus position, an intensity of the projected light may have two peaks. If the projection plane 170a is located at a position different from the best focus position, the intensity of the projected light may have four peaks. Further, the intensity of the projected light may have three peaks depending on the position of the projection plane 170a and an image scaling rate of the projection optical system 104.

Further, if the projection plane 170a is located at the best focus position, the intensity of the projected light may have a maximum peak value. Thus, the best focus of the projected light may be determined by the minimum number of the peaks and/or the maximum peak value according to an example embodiment.

In accordance with another example embodiment, the best focus position may be determined based on a variation of a distance between the outermost peaks in accordance with changes in a position of the projection plane. If the projection plane 170a is located at the best focus position, the distance of the outermost peaks is reduced to a minimum value. Thus, the best focus position may be determined to be the location of the projection plane 170a that corresponds to the minimum distance Dm between the outermost peaks as shown in FIG. 8.

According to example embodiments, the best focus position for an exposure process may be determined by the variations in the intensity of the projected light that has passed through the light-transmitting region(s). Particularly, because the reticle used for determining the best focus position may be illuminated by the illumination light used in the substrate exposure process, and the variations in the intensity of the projected light transmitted through the reticle and the projection optical system may be measured by the light sensor disposed on the substrate stage, the best focus position may be determined more precisely than in conventional methods.

Although specific example embodiments have been described, it is understood that the example embodiments are not be limited to the example embodiments described above, but that various changes and modifications can be made by those skilled in the art within the spirit and scope as hereinafter claimed.

What is claimed is:

1. A method of determining a focus position for a substrate exposure process, the method comprising:
    illuminating a reticle having a plurality of light-transmitting regions with an off-axis illumination light having a plurality of poles;
    focusing a projected light passing through the plurality of light-transmitting regions onto a projection plane;
    measuring an intensity of the projected light at the projection plane, the intensity of the projected light having a plurality of peaks of intensity; and
    determining the focus position based on a distance between the plurality of peaks of intensity.

2. The method of claim 1, wherein the off-axis illumination light has a pair of poles.

3. The method of claim 2, wherein the plurality of light-transmitting regions each extends in a direction substantially perpendicular to an arrangement direction of the pair of poles.

4. The method of claim 2, wherein the plurality of light-transmitting regions is arranged in substantially a same direction as an arrangement direction of the pair of poles.

5. The method of claim 1, wherein the intensity of the projected light is measured by a light sensor disposed on a stage for supporting a substrate.

6. The method of claim 5, wherein the projection plane is a light-receiving surface of the light sensor.

7. A substrate exposure apparatus, comprising:
    an illumination optical system providing an off-axis illumination light having a plurality of poles;
    a reticle stage supporting a reticle having a plurality of light-transmitting regions, the reticle being illuminated by the off-axis illumination light;
    a projection optical system focusing projected light passing through the reticle;
    a substrate stage having a substrate holder for holding a substrate;
    a light sensor disposed adjacent to the substrate holder to measure an intensity of the projected light having a plurality of peaks of intensity, the light sensor having a projection plane where the projected light is focused thereon; and
    a focusing system for determining a focus position based on a distance between the plurality of peaks of intensity.

8. The substrate exposure apparatus of claim 7, wherein the off-axis illumination light is a dipole illumination light having a pair of poles.

9. The substrate exposure apparatus of claim 8, wherein the plurality of light-transmitting regions each extends in a direction substantially perpendicular to an arrangement direction of the pair of poles.

10. The substrate exposure apparatus of claim 8, wherein the plurality of light-transmitting regions is arranged in substantially a same direction as an arrangement direction of the pair of poles.

11. The substrate exposure apparatus of claim 7, wherein the reticle stage is configured to support another reticle, and
    wherein image patterns transcribed onto the substrate are varied by replacing the reticle with the another reticle.

12. The substrate exposure apparatus of claim 8, wherein the substrate stage is configured to move in an optical axis direction of the projection optical system, and
    wherein the substrate stage is configured to move in a direction substantially perpendicular to the optical axis direction.

13. The substrate exposure apparatus of claim 12, wherein the light sensor measures variations of the plurality of peaks of intensity in accordance with changes in a position of the substrate stage in the optical axis direction of the projection optical system, and wherein the focusing system determines the focus position based on a minimum distance between outermost peaks in the variations of the plurality of peaks of intensity.

14. The method of claim 2, further comprising:

measuring variations of the plurality of peaks of intensity at the projection plane while moving the projection plane in an optical axis direction of the projected light;

wherein the focus position is determined based on a minimum distance between outermost peaks in the variations of the plurality of peaks of intensity.

15. The method of claim 14, wherein the reticle has a pair of light-transmitting regions.

16. The method of claim 15, wherein the pair of light-transmitting regions extends in a direction substantially perpendicular to an arrangement direction of the pair of poles, and wherein the pair of light-transmitting regions is arranged in substantially a same direction as the arrangement direction of the pair of poles.

* * * * *